United States Patent [19]

Sawyer, Jr. et al.

[11] 4,217,506
[45] Aug. 12, 1980

[54] LEVEL SELECTIVE A-C MONITORING CIRCUIT

[75] Inventors: Robert E. Sawyer, Jr., Epsom; Robert J. Donahue, Northwood, both of N.H.

[73] Assignee: Northern Telecom, Inc., Ottawa, Canada

[21] Appl. No.: 906,915

[22] Filed: May 17, 1978

[51] Int. Cl.² ............................................. H03K 5/153
[52] U.S. Cl. ..................................... 307/360; 307/359; 328/147; 328/150
[58] Field of Search ............... 307/350, 354, 360, 361, 307/359; 328/116, 139, 147, 148, 149, 150, 151; 340/661, 662, 663

[56] References Cited

U.S. PATENT DOCUMENTS

| | | | |
|---|---|---|---|
| 3,267,375 | 8/1966 | Olsen | 307/361 X |
| 3,544,983 | 12/1970 | Wallace, Jr. et al. | 307/361 X |
| 3,813,665 | 5/1974 | Parfomak et al. | 307/360 X |

OTHER PUBLICATIONS

B. P. Fenton et al., AC Current Detector Circuit, IBM Technical Disclosure Bulletin, vol. 19, No. 8, Jan. 1977, p. 3227.

Primary Examiner—John Zazworsky
Attorney, Agent, or Firm—Spencer & Kaye

[57] ABSTRACT

The present invention provides a circuit for monitoring an a-c input signal to determine if the signal level falls within a selectable level range.

9 Claims, 1 Drawing Figure

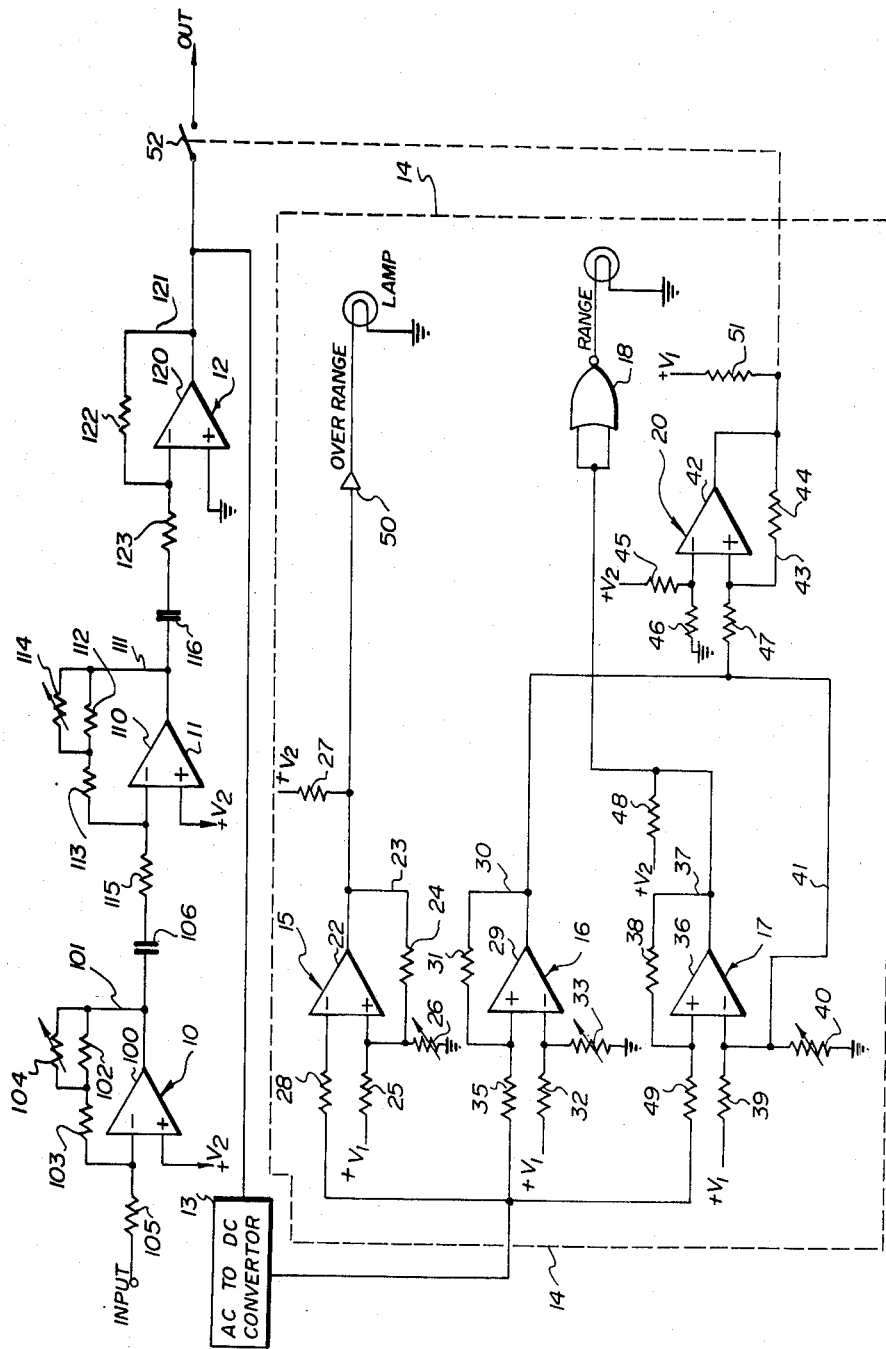

LEVEL SELECTIVE A-C MONITORING CIRCUIT

FIELD OF THE INVENTION

The present invention relates to a-c monitoring circuits and more particularly to a level selective a-c monitoring circuit.

SUMMARY OF THE INVENTION

In many areas of telecommunications there is a desire to measure a-c signals and perform testing and control functions based on these measurements. The present invention provides an a-c level monitoring circuit for determining whether the signal meets certain selectable criteria. For instance, whether the signal falls within a selectable level window.

According to the present invention there is provided a circuit for monitoring an a-c input signal including a selectable gain amplifier responsive to the a-c input signal; an a-c to d-c converter for converting the signals at the output of the selectable gain amplifier to corresponding d-c values. Two comparators are provided for comparing the d-c values one to a predetermined minimum a-c value and the other to a predetermined maximum value. The predetermined maximum value corresponds to a maximum acceptable value of the a-c input signal.

BRIEF DESCRIPTION OF THE DRAWING

A preferred embodiment of the invention will be described in conjunction with the accompanying drawing which is a schematic diagram of a circuit according to the present invention.

DESCRIPTION OF THE PREFERRED EMBODIMENT

As illustrated in the FIGURE the input signal is accepted by a series pair of variable gain amplifiers 10 and 11. Amplifier 10 comprises operational-amplifier (op-amp) 100 with negative feedback loop 101 including two series fixed resistances 102 and 103 and variable resistance 104 connected in parallel across the resistor 102. The input signal is applied to the inverting input terminal of the op-amp 100 through fixed resistor 105. The non-inverting input terminal of the op-amp 100 is connected to a reference voltage +V2. The output signal from the scaling amplifier 10 is a-c coupled to the amplifier 11 through capacitor 106.

The amplifier 11 comprises op-amp 110 with negative feedback loop 111 including two series fixed resistors 112 and 113 and variable resistance 114 connected in parallel across resistor 112. The signal is applied to the inverting input terminal through resistance 115. The non-inverting input terminal is also connected to the reference voltage +V2. The output signal from the scaling amp 11 is a-c coupled to fixed gain amplifier 12 through capacitor 116. The fixed gain amplifier 12 comprises op-amp 120 with negative feedback loop 121 including resistor 122. The signal is applied to the inverting input terminal through resistor 123. The non-inverting input terminal is connected to ground.

The variable resistances 104 and 114 are varied by thumbwheel switches. The output signal of the amplifier 12 is then converted to a corresponding d-c level by an a-c to d-c converter 13. Such a converter may be comprised of a peak detector and a buffer amplifier as is known in the art. The d-c output signal from the converter 13 is applied to a comparator stage 14.

The comparator stage 14 comprises three comparing amplifiers 15, 16, 17, a NOR-gate 18, and a fixed gain amplifier 20. The input terminals of the comparing amplifiers 15, 16 and 17 are connected in parallel to the output from the a-c to d-c converter 13. The comparing amplifier 15 compares its input signal to a reference level corresponding to the highest signal expected within the window. When the input signal exceeds this reference level the output of the comparing amplifier 15 goes low and the overrange indication through inverter 50 goes high.

Comparing amplifier 16 compares its input signal to a second reference level corresponding to the lowest signal expected within the selected level window. When the input signal exceeds the second reference level the output of the comparing amplifier 16 goes high.

The comparing amplifier 17 compares its input signal to a third reference level corresponding to the absolute maximum value of the selected level window. The output of the comparing amplifier 17 is low if the input signal is less than the third reference level; however a signal in feedback loop 41 from the comparing amplifier 16 causes the output of the comparing amplifier 17 to be high, when the input signal is less than the second reference level. When the input signal is greater than the second reference level and less than the third reference level the output of the comparing amplifier 17 is low. The NOR-gate 18 acts as an inverter to invert the output signals from the comparing amplifier 17. The output of the NOR-gate 18 is an inrange indication.

The comparing amplifier 15 comprises operational amplifier (op-amp) 22 having a positive feedback loop 23 containing a series resistor 24. A voltage divider comprising a fixed resistor 25, one terminal thereof connected to a reference voltage +V1 the other to the non-inverting input terminal of the op-amp 22 and to a terminal of a variable resistor 26, the other terminal thereof grounded, provides the necessary reference voltage for the comparing amplifier 15. In this case the reference is a d-c reference level corresponding to the upper limit of the selected level window. The output terminal of the op-amp 22 is biased by resistor 27 to the reference voltage +V2. The signal is applied to the inverting terminal of the op-amp 22 through input resistor 28.

The comparing amplifier 16 comprises op-amp 29 having a positive feedback loop 30 containing series resistor 31. A voltage divider comprising a fixed resistor 32, one terminal thereof connected to the reference voltage +V1, the other to the inverting input terminal of the op-amp 29 and to a terminal of a variable resistor 33, the other terminal thereof grounded, provides the necessary reference voltage for the comparing amplifier 16. In this case the reference is the d-c reference level corresponding to the lower limit of the selected level window. The output signal from the op-amp 22 provides a signal through inverter 50. The input signal is applied to the non-inverting terminal of the op-amp 29 through resistor 35.

The comparing amplifier 17 comprises op-amp 36 having a positive feedback loop 37 containing series resistance 38. A voltage divider comprising fixed resistor 39, one terminal thereof connected to +V1, the other to the inverting input and to a terminal of a variable resistor 40, the other terminal thereof grounded, provides the necessary reference voltage for the comparing amplifier 17. In this case the reference is the d-c reference level corresponding to the absolute maximum value of the selected level window. A negative feedback loop 41 to the op-amp 36 comes from the comparing amplifier 16.

The fixed gain amplifier 20 is a voltage follower and comprises op-amp 42 having positive feedback loop 43 containing resistor 44. Connected to the inverting terminal of op-amp 42 are resistors 45 and 46. The resistor 45 is also connected to the reference voltage +V2. The resistor 46 is grounded. The input signal to the op-amp 42 is the output signal of the comparing amplifier 16 and is applied through resistor 47. The signal to the op-amp 36 is applied through resistor 49. The output terminal of the fixed gain amplifier 20 is biased by resistor 51 to the reference voltage +V1. The output signal from the fixed gain amplifier 20 controls switch 52.

The output terminal of the op-amp 36 is biased by resistor 48 to the reference voltage +V2. The output signal from the op-amp 36 drives two inputs of the NOR-gate 18 to obtain an acceptable range indication.

In operation the reference levels for each of the three comparators are preset. The reference level selected for the minimum reference level is the d-c level corresponding to −10 dBm or any other convenient value. The extent of the window must also be selected. If the window is to be an 8 dB window, for example, then the reference level of the upper value will be the d-c level corresponding to −2 dBm. The allowable overrange must also be preselected. If an additional 4 dB can be accepted above the window, then the reference level for the absolute maximum corresponds to +2 dBm.

The acceptable level window is chosen at the variable scaling amplifier. For example let 0 dBm use the minimum value of acceptable signal. Therefore because it is an 8 dB window, +8dBm will be the upper value and +12 dBm will be the absolute maximum value of acceptable signal.

The variable scaling amplifiers scale the incoming signal, so in the case of the example, an incoming signal having a level of 0 dBm the minimum acceptable will be scaled to −10 dBm, an incoming signal of +8 will be scaled to −2 dBm and so on.

The scaling is done in two stages. The first scaling amplifier scales in 10 dB steps, the second in 1 dB steps. Thumbwheel switches calibrated in dB showing the minimum value of the level window can be used to operate the variable resistances in the feedback loops of the variable scaling amplifiers.

The comparing amplifier 15 has a low output when the upper limit of the predetermined range is exceeded, otherwise it has a high output. The comparing amplifier 17, due to the feedback loop 41, provides a low output when the input signal is between the absolute maximum and the minimum value of the predetermined range, otherwise the output is high.

Thus, for signals having levels less than the minimum value both the inrange and the overrange lamps are extinguished; for signals having levels falling between the minimum value and the absolute maximum value the inrange lamp is illuminated, for signals having levels greater than the upper limit the overrange lamp is also illuminated.

What is claimed is:

1. A circuit for monitoring an a-c input signal comprising a selectable gain amplifier responsive to said input signal, an a-c to d-c converter for converting signals at the output of said selectable gain amplifier to corresponding d-c values, a first comparator for comparing said d-c values to a predetermined minimum d-c value, a second comparator for comparing said d-c values to a predetermined maximum d-c value, said predetermined maximum value corresponding to a maximum acceptable value of said input signal, a third comparator for comparing said d-c values to a predetermined absolute maximum a-c value, and feedback means connected between the output of said first comparator and said third comparator for causing said third comparator to compare said d-c values to said minimum d-c value, said predetermined absolute maximum value corresponding to an absolute maximum acceptable value of said input signal, said absolute maximum acdeptable value being greater than said maximum value.

2. A circuit as claimed in claim 1, said feedback means comprising feedback loop from the output of said first comparator to the inverting input terminal of said third comparator.

3. A circuit for monitoring an a-c input signal comprising: a selectable gain amplifier composed of first and second variable gain amplifiers, each of said variable gain amplifiers comprising an operational amplifier having a negative feedback loop containing two series resistors, and a variable resistor connected in parallel with one of said two series resistors, with each said operational amplifier having its non-inverting input terminal connected to a first reference voltage, said selectable gain amplifier further including a first additional resistor connected in series with the inverting input terminal of said operational amplifier of said first variable gain amplifier for applying an input signal thereto, and a second additional resistor connected in series between the output terminal of said operational amplifier of said first variable gain amplifier and the inverting input terminal of said operational amplifier of said second variable gain amplifier for applying an input signal to said second variable gain amplifier; an a-c to d-c converter for converting signals at the output of said selectable gain amplifier to corresponding d-c values; a first comparator for comparing said d-c values to a predetermined minimum d-c value; and a second comparator for comparing said d-c values to a predetermined maximum d-c value, said predetermined maximum value corresponding to a maximum acceptable value of said input signal.

4. A circuit as defined in claim 3 wherein said variable resistors are each adjustable in steps such that the gain of said first variable gain amplifier varies in steps of 10 dB per step and the gain of said second variable gain amplifier varies in steps of 1 dB.

5. A circuit as claimed in claim 1 wherein the output signal of said second comparator is inverted and gives indication that said a-c input signal has a value greater than said predetermined minimum value.

6. A circuit as claimed in claim 1 wherein the output signal of said third comparator drives two inputs of a NOR-gate to provide an indication that said a-c input signal has a value between said predetermined absolute maximum value and said predetermined minimum value.

7. A circuit as claimed in claim 2 further comprising a variable resistor connected to said first comparator for permitting adjustment of said predetermined minimum value.

8. A circuit as claimed in claim 2 further comprising a variable resistor connected to said second comparator for permitting adjustment of said predetermined maximum value.

9. A circuit as claimed in claim 1, said third comparator having said predetermined absolute maximum value adjustable by means of a variable resistor.

* * * * *

UNITED STATES PATENT AND TRADEMARK OFFICE
CERTIFICATE OF CORRECTION

PATENT NO. : 4,217,506

DATED : August 12, 1980

INVENTOR(S) : Robert E. Sawyer, Jr. et al

It is certified that error appears in the above—identified patent and that said Letters Patent is hereby corrected as shown below:

In the heading of the patent, under [73] Assignee, change "Ottawa, Canada" to -- Nashville, Tennessee --.

Signed and Sealed this

Fifteenth Day of June 1982

[SEAL]

Attest:

GERALD J. MOSSINGHOFF

Attesting Officer

Commissioner of Patents and Trademarks